(12) United States Patent
Hornung

(10) Patent No.: US 7,362,578 B2
(45) Date of Patent: Apr. 22, 2008

(54) HEAT SINK FASTENING SYSTEM

(75) Inventor: Craig Warren Hornung, Harrisburg, PA (US)

(73) Assignee: Tyco Electronics Corporation, Middletown, PA (US)

( * ) Notice: Subject to any disclaimer, the term of this patent is extended or adjusted under 35 U.S.C. 154(b) by 206 days.

(21) Appl. No.: 11/247,018

(22) Filed: Oct. 11, 2005

(65) Prior Publication Data

US 2007/0041158 A1    Feb. 22, 2007

Related U.S. Application Data

(60) Provisional application No. 60/708,640, filed on Aug. 16, 2005.

(51) Int. Cl.
*H05K 7/20* (2006.01)
*F28F 7/00* (2006.01)
*H01L 23/34* (2006.01)

(52) U.S. Cl. ............... 361/704; 165/80.3; 165/185; 257/719; 361/697; 361/719

(58) Field of Classification Search ........ 257/718–719; 361/697
See application file for complete search history.

(56) References Cited

U.S. PATENT DOCUMENTS

| 5,353,191 | A  | * | 10/1994 | Volz et al. ................. 361/690 |
| 5,397,919 | A  | * | 3/1995  | Tata et al. .................. 257/717 |
| 5,566,052 | A  | * | 10/1996 | Hughes ....................... 361/704 |
| 5,596,485 | A  | * | 1/1997  | Glenn et al. ................ 361/703 |
| 5,667,870 | A  | * | 9/1997  | McCullough ............... 301/101 |
| 5,708,564 | A  | * | 1/1998  | Lin ............................. 361/704 |
| 6,075,699 | A  |   | 6/2000  | Rife |
| 6,293,331 | B1 |   | 9/2001  | Wang |
| 6,343,012 | B1 | * | 1/2002  | Rife ........................... 361/695 |
| 6,386,274 | B1 |   | 5/2002  | Wang et al. |
| 6,452,803 | B1 | * | 9/2002  | Liu ............................ 361/704 |
| 6,519,150 | B1 | * | 2/2003  | Chen et al. ................ 361/697 |
| 6,681,949 | B2 |   | 1/2004  | Tibor |
| 6,828,673 | B2 | * | 12/2004 | Ficorilli et al. ............ 257/707 |

* cited by examiner

*Primary Examiner*—Gregory D Thompson

(57) ABSTRACT

A heat sink assembly for removing heat from an electronic component includes a retention clip having a central body and a securing member extending from the central member. The central member has an opening there through, and the securing member is configured to secure the retention clip relative to the electronic component. A heat sink has a base member received through the opening when the heat sink is mounted to the retention clip, and the base member has an engagement surface configured to engage a heat generating surface of the electronic component. A locking mechanism secures the heat sink to the retention clip. The locking mechanism includes a ramp member and a ramp engaging member, wherein the ramp member has a positive stop provided therein. The positive stop provides a tactual indication when the heat sink is fully secured to the retention clip.

20 Claims, 4 Drawing Sheets

HEAT SINK FASTENING SYSTEM

CROSS REFERENCE TO RELATED APPLICATIONS

This application claims priority to and the benefit of the filing date of U.S. Provisional Application No. 60/708,640, filed on Aug. 16, 2005 and which is hereby incorporated by reference in its entirety.

BACKGROUND OF THE INVENTION

This invention relates generally to heat sinks, and more particularly to heat sink fastening systems operable without the use of a tool.

It is well known to use a heat sink to cool a heat generating component or package. Typically, a heat sink is arranged in close contact with heat generating components of the package. Heat generated by the component is transferred to the heat sink and then dissipated from the heat sink to the surrounding air.

Conventional heat sinks are attached to the electronic component or package with a spring clip. The spring clip provides a fastening force between the heat sink and the component. The heat sink is connected to the spring clip in a conventional manner, such as by a threaded coupling. The amount of torque applied to the heat sink produces a corresponding engagement force between the heat sink and the component.

However, over-tightening of the heat sink and the spring clip may result in damage to the electronic component as too much force may be applied to the component, and the component may crack or break. Under-tightening of the heat sink and the spring clip may result in improper thermal engagement between the heat sink and the component. As a result, conventional coupling techniques for the heat sink and spring clips utilize a torque wrench to limit the amount of torque applied to the heat sink. However, the use of a torque wrench increases assembly time. Additionally, the torque wrench typically requires calibration which also increases assembly time and the possibility of operator error.

BRIEF DESCRIPTION OF THE INVENTION

In one aspect, a heat sink assembly is provided for removing heat from an electronic component. The heat sink assembly includes a retention clip having a central body and a securing member extending from the central member. The central member has an opening there through, and the securing member is configured to secure the retention clip relative to the electronic component. A heat sink has a base member received through the opening when the heat sink is mounted to the retention clip, and the base member has an engagement surface configured to engage a heat generating surface of the electronic component. A locking mechanism secures the heat sink to the retention clip. The locking mechanism includes a ramp member and a ramp engaging member, wherein the ramp member has a positive stop provided therein. The positive stop provides a tactual indication when the heat sink is fully secured to the retention clip.

One embodiment of the heat sink assembly may include one of the heat sink and retention clip having the ramp member, while the other of the heat sink and retention clip having the ramp engaging member. Optionally, the ramp engaging member includes a protrusion extending from the base member, and the protrusion rides along the ramp member to the positive stop during assembly of the heat sink assembly. The central body of the retention clip may include a slot positioned adjacent and open to the opening, wherein the slot is sized to allow the protrusion to pass therethrough. The ramp member may be located proximate the opening, and the ramp member may have a detent therein, wherein the detent constitutes the positive stop. Optionally, the ramp member may extend from a first end to a second end, wherein the ramp member is oblique with respect to the central member between the first and second ends. In one embodiment, the retention clip is flexed as the ramp engaging member engages the ramp member when the heat sink is secured to the retention clip, such that the flexing of the retention clip provides an increase in a tension force between the base member and the electronic component.

In another aspect, a heat sink fastening clip is provided for thermally securing a heat sink to an electronic component. The electronic component has a heat generating surface and the heat sink has a base member having an engagement surface configured to engage a heat generating surface of the electronic component. The heat sink fastening clip includes a central member having an opening extending therethrough, wherein the base member of the heat sink is received within the opening such that the base member engages the heat generating surface of the electronic component. A securing member extends from the central member, and the securing member is configured to secure the central member relative to the electronic component. A ramp member is connected to the central member proximate the opening. The ramp member has a positive stop therein, wherein the base member is configured to engage the positive stop during assembly of the heat sink and the fastening clip. The positive stop provides a tactual indication when the heat sink is fully secured to the retention clip.

DETAILED DESCRIPTION OF THE INVENTION

Figure 1:
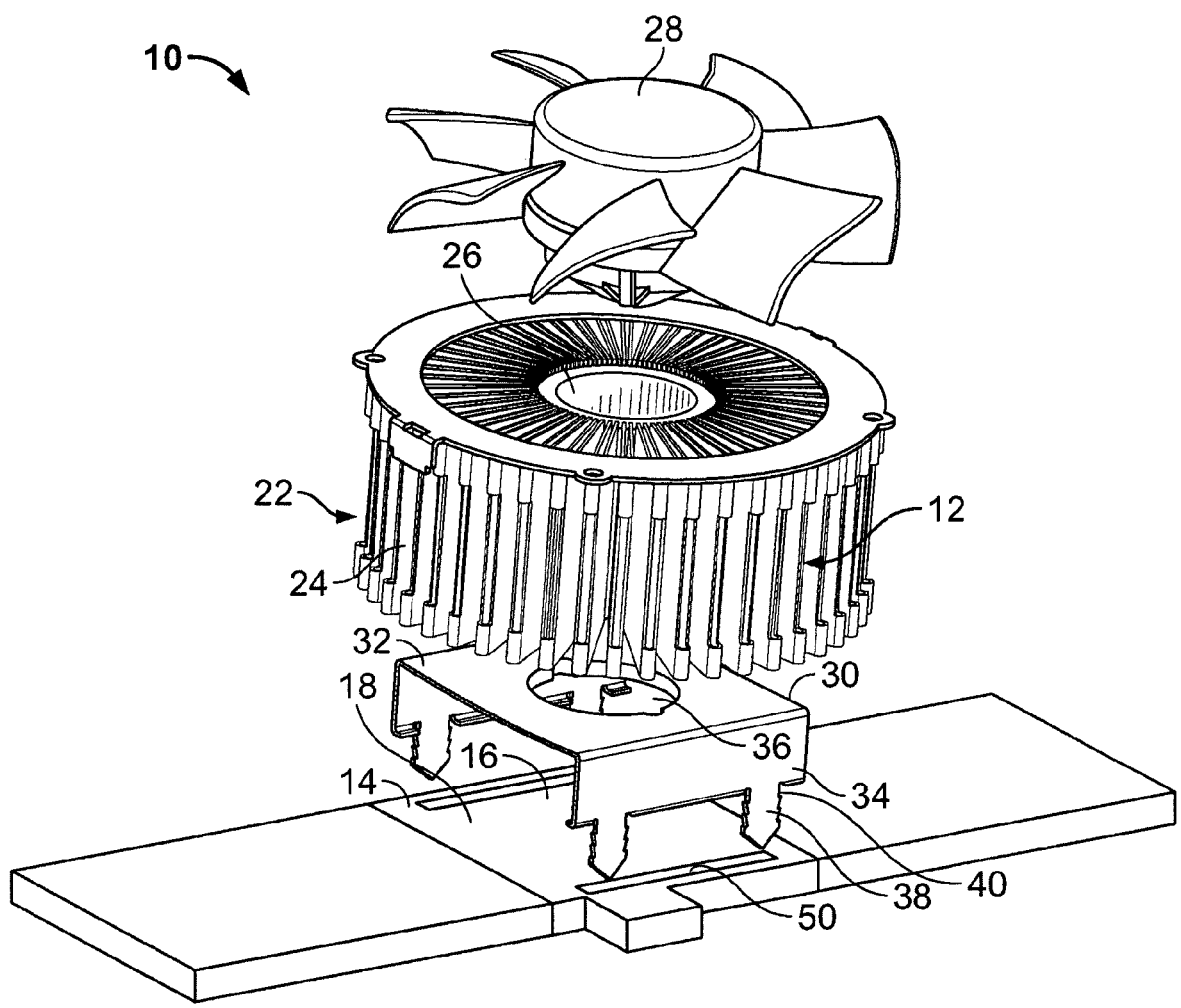
FIG. 1 is an exploded perspective view of a heat sink assembly formed in accordance with an exemplary embodiment of the present invention.

FIG. 1 is an exploded perspective view of a heat sink assembly 10 formed in accordance with an exemplary embodiment of the present invention. The heat sink assembly 10 includes a heat sink 12 capable of cooling at least one electronic component or package 14. The electronic component 14 has a first or upper side 16 defining a heat generating surface 18. The electronic component 14 may be a circuit board, a central processing unit (CPU), a connector, or the like. In one embodiment, the electronic component 14 may include an integrated heat sink (not shown) defining the heat generating surface 18.

Figure 2:
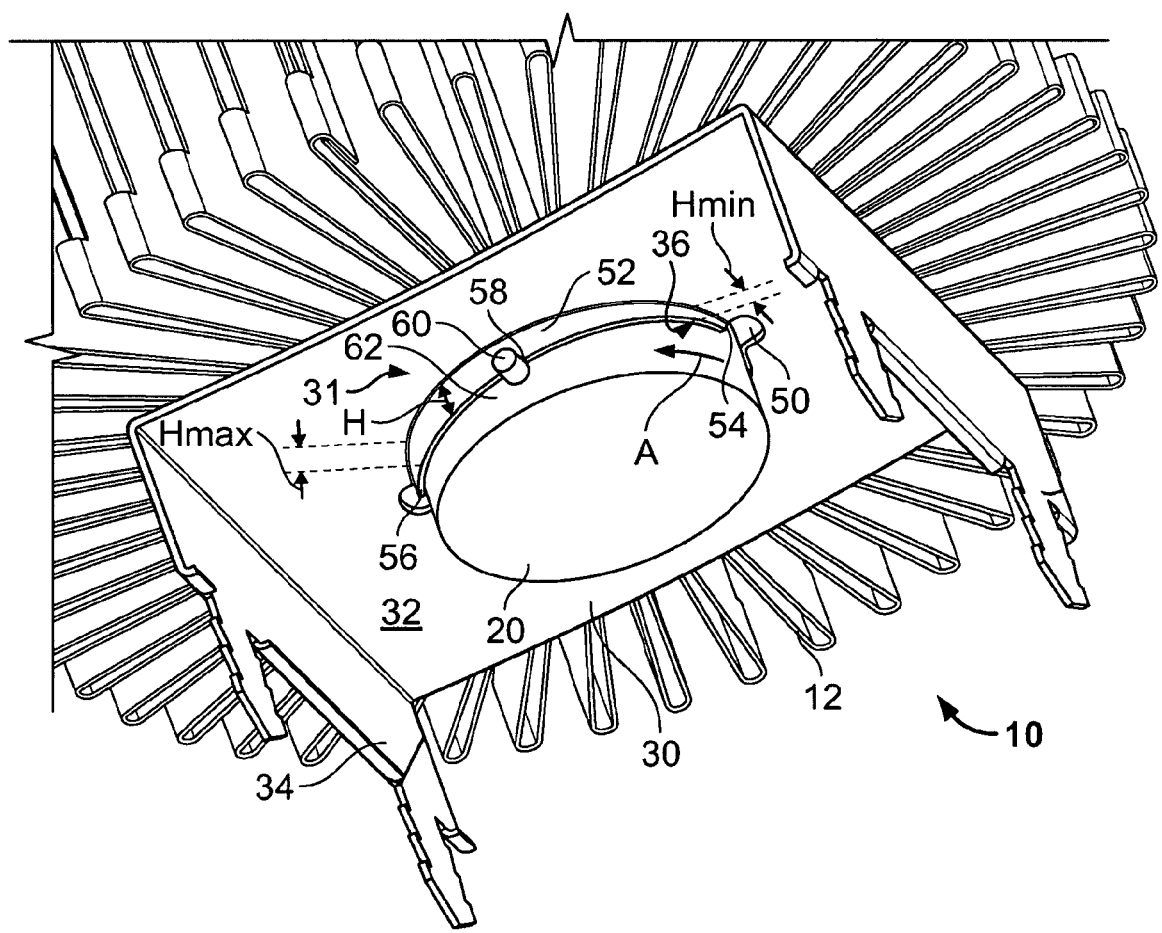
FIG. 2 is a bottom perspective view of the heat sink assembly shown in FIG. 1 in an assembled state illustrating a heat sink fastening clip used with the heat sink assembly.

As better shown in FIG. 2, the heat sink 12 includes a base member 20 for engaging the electronic component 14. The base member 20 is preferably fabricated from a thermally conductive material, such as copper or aluminum, selected to efficiently and reliably dissipate heat from the electronic component 14. The heat sink 12 may also include a fin structure 22 in thermal communication with the base member 20 to aid in dissipating the heat transferred through the base member 20. The fin structure 22 includes a plurality of fins 24 having a large surface area that effectively dissipates the heat transferred through the base member 20 to the fin structure 22. Optionally, the fins 24 extend radially outward from a central core 26. In one embodiment, the core 26 may be fabricated from a material having a first thermal transfer rate, and the fins 24 may be fabricated from a material having a second thermal transfer rate, which is lower than the thermal transfer rate of the core 26.

In one embodiment, the heat sink assembly 10 also includes a fan 28 positioned proximate the fin structure 22 to aide in cooling the heat sink 12. The fan 28 generates airflow past the heat sink 12 to aide in cooling the heat sink 12. As a result, the heat sink 12 may transfer heat from the electronic component 14 more efficiently.

The heat sink assembly 10 includes a retention member or fastening clip 30 for securing the heat sink 12 in thermal communication with the electronic component 14. Additionally, as better shown in FIG. 2, the heat sink assembly 10 includes a locking mechanism 31 for securing the heat sink 12 to the retention member 30. In one embodiment, the retention member 30 is a spring clip, however other types of retention members 30 may be used, such as a screw or bolt. The heat sink 12 is capable of being secured, fastened or otherwise coupled to the retention member 30, and the retention member 30 is capable of being secured, fastened, or otherwise coupled to the electronic component 14. As a result, the heat sink 12 is held in thermal contact with the heat generating surface 18 of the electronic component 14 by the retention member 30. Optionally, the retention member 30 provides an engagement force onto the heat sink 12 such that the heat sink 12 maintains proper engagement with the electronic component 14. For example, the retention member 30 may be placed in tension when the heat sink 12 is coupled to the retention member 30, or the retention member 30 may be placed in tension when the retention member 30 is coupled to the electronic component 14. Optionally, the tension force may be adjustable by adjusting the position of the heat sink 12 with respect to the retention member 30 to provide an appropriate amount of force between the heat sink 12 and the electronic component 14.

In one embodiment, the retention member 30 includes a central body or member 32 and at least one securing member 34 integrally formed therewith. The central member 32 is substantially planar and is oriented substantially parallel to the upper side 16 of the electronic component 14. The central member 32 provides a base for the heat sink 12 to rest on. The central member 32 includes an opening 36 extending therethrough for receiving the heat sink 12, and more particularly the base member 20 of the heat sink 12. Optionally, the opening 36 may be threaded to facilitate coupling the heat sink 12 to the retention member 30. When assembled, the opening 36 is substantially aligned with the heat generating surface 18 of the electronic component 14 such that, after assembly, the heat sink 12 may engage the heat generating surface 18.

Each securing member 34 extends substantially perpendicular to the central member 32 and is coupled to the electronic component 14. Optionally, the retention member 30 includes two opposed securing members 34 extending downward from opposite ends of the central member 32. The securing members 34 include posts or legs 38 extending therefrom. The posts 38 extend into corresponding holes in the electronic component 14 such that the retention member 30 may be mounted to the electronic component 14. Optionally, the posts 38 may include barbs 40 extending outward therefrom for engaging the body of the electronic component 14 to resist removal of the retention member 30 from the electronic component 14.

FIG. 2 is a bottom perspective view of the heat sink assembly 10 in an assembled state illustrating the heat sink 12 coupled to the retention member 30 using the locking mechanism 31. In one embodiment, the locking mechanism 31 includes a ramp member, such as ramp member 52, and a ramp engaging member, such as protrusion 60, both of which are described in more detail below. When assembled, the base member 20 of the heat sink 12 is received within the opening 36 of the retention member 30. As illustrated in FIG. 2, in one embodiment, the base member 20 and the opening 36 are circular. As such, the base member 20 may be rotated within the opening 36, as will be described in detail below.

The retention member 30 includes at least one receiving slot 50 in the central member 32 positioned proximate the opening 36, such as along the perimeter of opening 36 and extending radially outward therefrom. Optionally, the retention member 30 includes two receiving slots 50 aligned approximately 180 degrees from one another along opening 36. In one embodiment, the slots 50 extend outward from the opening 36 toward the securing members 34.

The retention member 30 also includes at least one ramp member 52 extending downward from the central member 32 and along the perimeter of opening 36. Each ramp member 52 extends between a first end 54 and a second end 56. Optionally, the first end 54 and the second end 56 are each positioned adjacent the slots 50 such that the ramp member 52 extends circumferentially from one slot 50 to the next slot 50 along the perimeter of the opening 36. The ramp member 52 generally extends obliquely with respect to the central member 32 between the first and second ends 54 and 56. For example, at the first end 54, the ramp member 52 has a minimum height, $H_{min}$ such as approximately zero. At the second end 56, the ramp member 52 has a non-zero maximum height $H_{max}$ which is greater than a height H at any other point along ramp member 52. Additionally, the ramp member 52 includes a positive stop 58. In one embodiment, the positive stop 58 is a detent, or area of reduced height, along the ramp member 52. Optionally, the detent 58 is radiused to provide a transition along the ramp member 52. In one embodiment, the detent 58 is positioned approximately equidistant between the first and second ends 54 and 56 of the ramp member 52. Alternatively, the detent 58 is positioned closer to one of the first and second ends 54 and 56.

The base member 20 of the heat sink 12 includes at least one projection or pin 60 extending radially outward from a side wall 62 of the base member 20. Optionally, the projection 60 has a cylindrical shape such that the projection 60 has a curved outer surface. In one embodiment, the heat sink 12 includes two projections 60 generally opposed from one another. The projections 60 extend outward from the side wall 62 for a distance such that a width of the base member 20 and the outer portion of each projection 60 is greater than the diameter of the opening 36 of the central member 32. As a result, the base member 20 may not be inserted into the opening 36 unless the projections 60 are aligned with the slots 50 in the central member 32. As such, the slots 50 in the central member 32 must be sized to accommodate the projections 60 during assembly of the heat sink assembly 10.

As illustrated in FIG. 2, the locking mechanism 31 includes the ramp member 52 and the protrusion 60. In an alternative embodiment, the base member 20 may include a structure similar to ramp member 52, and the retention member 30 may include a structure similar to protrusion 60. The assembly of the base member 20 and the retention member 30 would be substantially similar to the assembly of the structure illustrated in FIG. 2, and described below.

During assembly, the projections 60 are aligned with the slots 50 and the base member 20 is received in the opening 36 until the projections 60 are positioned below the central member 32 of the retention member 30. The heat sink 12 is then rotated in the direction of arrow A, such as in a direction generally toward the first end 54 of the ramp member 52. As the heat sink 12 is rotated, the projections 60 ride up the ramp member 52 and draw the heat sink 12 into engagement with the electronic component 14 (shown in FIG. 1). Additionally, when the second end 56 of the ramp member 52 is positioned adjacent the slot 50, the second end 56 operates as a stop for rotation of the heat sink 12 in the wrong direction. As such, the heat sink 12 may only be rotated in the direction of arrow A when the projections 60 are within the slots 50. The heat sink 12 is rotated until the projections 60 engage the detents 58. As such, the detents 58 facilitate providing a mechanical indication to an operator that the heat sink 12 is loaded onto retention member 30. Optionally, the heat sink 12 is fully loaded onto the retention member 30 when the projections 60 engage the detents 58. In one embodiment, the detents 58 operate to limit further rotation of the heat sink 12. Alternatively, the detents 58 are sized and shaped such that further pressure or torque to the heat sink 12 will facilitate further tightening of the heat sink 12.

Figure 3:
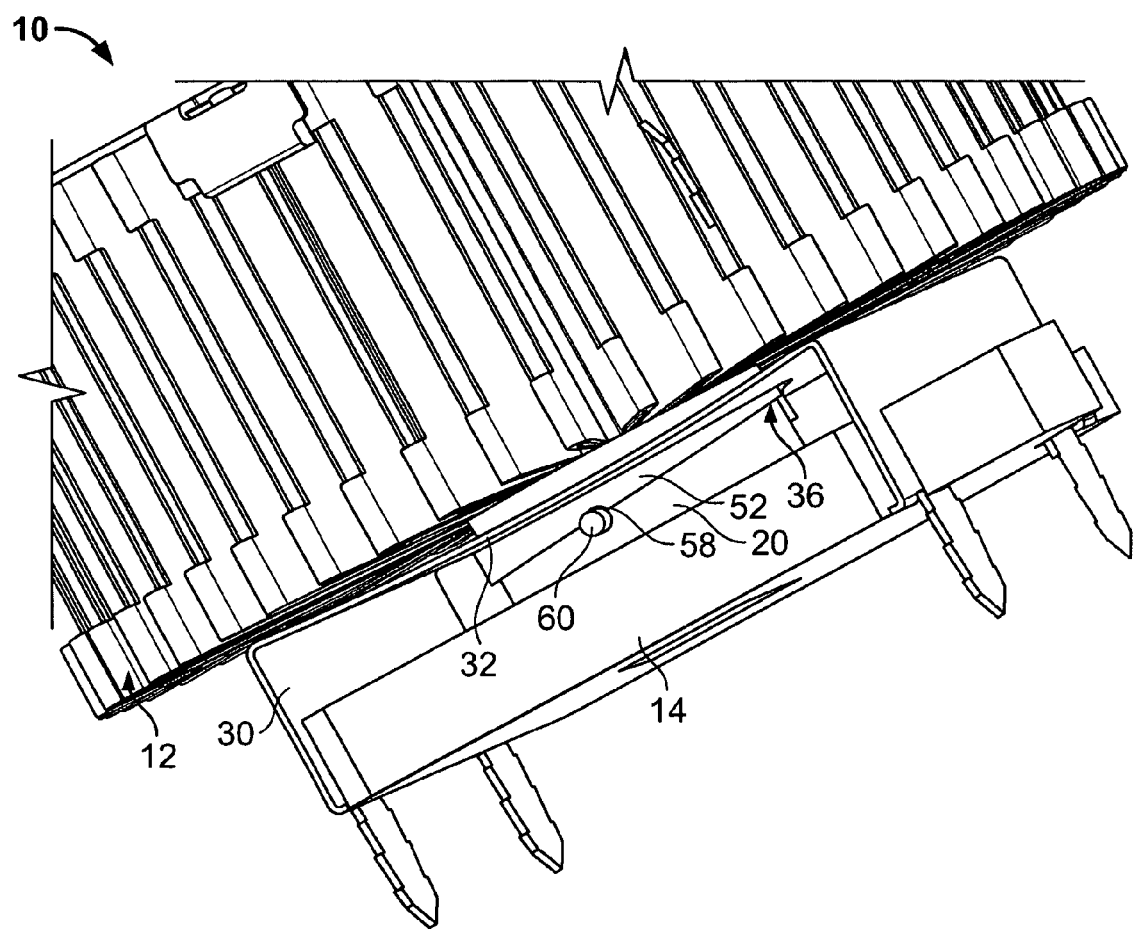
FIG. 3 is a side perspective view of the heat sink assembly and fastening clip shown in FIG. 2.

FIG. 3 is a side perspective view of the heat sink assembly 10 and fastening clip 30 illustrating the heat sink 12 in thermal engagement with the electronic component 14. More particularly, the base member 20 is positioned within the opening 36 and the heat sink 12 has been rotated to a loaded position such that the projections 60 have engaged the detents 58.

In one embodiment, the central member 32 of the retention member 30 is pre-flexed or pre-bowed in a downward direction (e.g. toward from the electronic component 14 when assembled). The pre-flexing allows the central member 32 to become substantially planar as the projections 60 are moved along the ramp members 52. Specifically, the amount of flexing in the central member 32 is reduced as the heat sink 12 is rotated, and simultaneously, the retention member 30 imparts a greater tension force on the heat sink 12. The greater tension force between the heat sink 12 and the retention member 30 corresponds to a greater engagement force between the heat sink 12 and the electronic component 14. The detents 58 are positioned along the ramp members 52 to provide an appropriate amount of engagement force between the heat sink 12 and the electronic component 14. Additionally, because the central member 32 is allowed to flex, the risk of over-tightening the heat sink 12 with respect to the retention member 30 is substantially reduced, if not eliminated.

Figure 4:
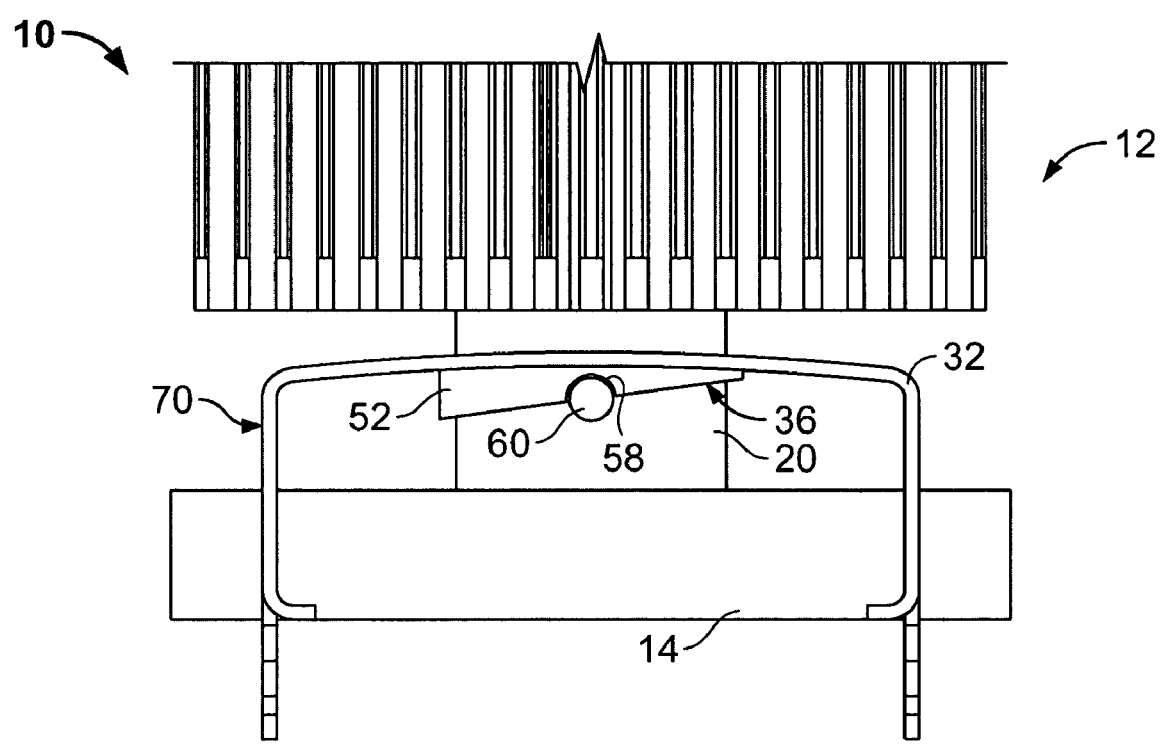
FIG. 4 is a side view of the heat sink assembly having an alternative fastening clip.

FIG. 4 is a side view of the heat sink assembly 10 and an alternative fastening clip 70. The fastening clip 70 is similar to the fastening clip 70, and as such, like components are numbered with like reference numerals. The heat sink 12 is illustrated as being loaded and engaged with the fastening clip 70 and thermally engaging the electronic component 14. More particularly, the base member 20 is positioned within the opening 36 of the fastening clip 70 and the heat sink 12 has been rotated such that the projections 60 have engaged the detents 58.

As further illustrated in FIG. 4, the central member 32 of the retention member 70 has been bowed or flexed upwardly (e.g. away from the electronic component 14) from an unflexed and substantially planar orientation. The flexing is caused by the positioning of the projections 60 along the ramp members 52. Specifically, as the heat sink 12 is rotated, the central member 32 becomes more flexed, thus imparting a greater tension force between the heat sink 12 and the retention member 70. The greater tension force between the heat sink 12 and the retention member 70 corresponds to a greater engagement force between the heat sink 12 and the electronic component 14. The detents 58 are positioned along the ramp members 52 to provide an appropriate amount of engagement force between the heat sink 12 and the electronic component 14. Additionally, because the central member 32 is allowed to flex, the risk of over-tightening the heat sink 12 with respect to the retention member 70 is substantially reduced, if not eliminated.

The design and structure of the retention member 30 facilitate assembling the heat sink assembly 10 without the need for a tool such as a torque wrench. Rather, an operator rotates the heat sink 12 until the projections 60 mechanically engage the detents 58. Removal of the heat sink 12 is accomplished by rotating the heat sink 12 in the opposite direction either by hand or with the use of a tool such as a wrench. However, by positioning the ramp member 52 as a stop, the heat sink 12 cannot be over-tightened in the opposite direction. As a result, a cost effective and reliable means is provided for assembling the heat sink assembly 10. The assembly time is reduced as compared to heat sink assemblies which are assembled using a torque wrench, and the risk of over-tightening or under-tightening the heat sink 12 with respect to the retention member 30 is substantially reduced, if not eliminated. Thus the risk of operator error is reduced with the use of the heat sink assembly 10.

While the invention has been described in terms of various specific embodiments, those skilled in the art will recognize that the invention can be practiced with modification within the spirit and scope of the claims.

What is claimed is:

1. A heat sink assembly for removing heat from an electronic component, said heat sink assembly comprising:
    a retention clip having a central body and a securing member extending from said central body, said central body defining a plate extending between opposed sides and opposed ends, said central body having an opening there through, said securing member extending from said central body proximate at least one of said opposed ends and said securing member being configured to secure said retention clip relative to the electronic component;
    a heat sink having a base member received though said opening when said heat sink is mounted to said retention clip, said base member having an engagement surface configured to engage a heat generating surface of the electronic component, and
    a locking mechanism securing said heat sink to said retention clip, said locking mechanism including a ramp member and a ramp engaging member, said ramp member defining a positive stop;
    wherein said central body is flexed from said opening to said sides and to said ends as said ramp member engages said ramp engaging member.

2. A heat sink assembly of claim 1, wherein one of said heat sink and retention clip includes said ramp member, while the other of said heat sink and retention clip includes said ramp engaging member.

3. A heat sink assembly of claim 1, wherein said ramp engaging member comprises a protrusion extending from said base member, said protrusion riding along said ramp member to said positive stop during assembly of said heat sink assembly.

4. A heat sink assembly of claim 3, wherein said central body of said retention clip comprises a slot positioned adjacent and open to said opening, said slot sized to allow said protrusion to pass therethrough.

5. A heat sink assembly of claim 1, wherein said ramp member is located proximate said opening, said ramp member having a detent therein, said detent constituting said positive stop.

6. A heat sink assembly of claim 1, wherein said retention clip is pre-flexed such that said central body is initially non-planar and said retention clip is flexed during assembly such that said central body is substantially planar after said heat sink is mounted to the electronic component.

7. A heat sink assembly of claim 1, wherein said ramp member extends from a first end to a second end, said ramp member is oblique with respect to said central body between said first and second ends.

8. A heat sink assembly of claim 1, wherein said retention clip is flexed as said ramp engaging member engages said ramp member when said heat sink is secured to said retention clip, the flexing of said retention clip is configured to provide an increase in a tension force between said base member and the electronic component.

9. A heat sink assembly of claim 1, wherein adjusting the position of the ramp engaging member along said ramp member is configured adjust a tension force between said heat sink and the electronic component.

10. A heat sink assembly of claim 1, wherein said heat sink is rotatably coupled to said retention clip during assembly of said heat sink assembly, wherein as said heat sink is rotated, said ramp engaging member rides along said ramp member to said positive stop.

11. A heat sink assembly of claim 1, wherein said positive stop prevents overdrive of said heat sink with respect to said retention clip.

12. A heat sink fastening clip for thermally securing a heat sink to an electronic component, the electronic component having a heat generating surface and the heat sink having a base member having an engagement surface configured to engage a heat generating surface of the electronic component, said heat sink fastening clip comprises:
a central member having an opening extending therethrough, wherein the opening is configured to receive the base member of the heat sink such that the base member engages the heat generating surface of the electronic component;
a securing member extending from said central member, said securing member being configured to secure said central member relative to the electronic component; and
a ramp member connected to said central member proximate said opening, said ramp member extending between opposed ends that are positioned on generally opposite sides of the opening, said ramp member having a substantially continuous slope between the opposed ends, and said ramp member defining a positive stop, wherein said positive stop is configured to provide a tactual indication when the heat sink engages the positive stop.

13. A heat sink fastening clip of claim 12, wherein the base member has a pin extending therefrom, said ramp member defining an engagement surface for the pin, the pin being configured to ride along said ramp member to said positive stop.

14. A heat sink fastening clip of claim 13, wherein said central member comprises a slot positioned adjacent and open to said opening, said slot having a predetermined size configured to allow the pin to pass therethrough when the heat sink is coupled to the fastening clip.

15. A heat sink fastening clip of claim 12, wherein said securing member is configured to secure the fastening clip to the electronic component such that said opening and ramp member are substantially aligned with and spaced apart from the heat generating surface of the electronic component.

16. A heat sink fastening clip of claim 12, wherein said ramp member extends between a first end and a second end, said ramp member is oblique with respect to said central member between said first and second ends.

17. A heat sink fastening clip of claim 12, wherein said central member is configured to flex as the heat sink engages said ramp member during assembly of the heat sink and the fastening clip, the flexing of said central member is configured to provide an increase in a tension force between the heat sink and the electronic component.

18. A heat sink fastening clip of claim 12, wherein said ramp member is configured to adjust a tension force between the heat sink and the electronic component.

19. A heat sink fastening clip of claim 12, wherein said fastening clip is configured to rotably receive said heat sink during assembly, wherein as the heat sink is rotated, a pin extending from the base member is configured to ride along said ramp member to said positive stop.

20. A heat sink fastening clip of claim 12, wherein said ramp member is located proximate said opening, said ramp member having a detent therein, said detent constituting said positive stop.

* * * * *